(12) United States Patent
Bajaj et al.

(10) Patent No.: US 11,489,503 B1
(45) Date of Patent: Nov. 1, 2022

(54) CROSS-COUPLING OF SWITCHED-CAPACITOR OUTPUT COMMON-MODE FEEDBACK CAPACITORS IN DYNAMIC RESIDUE AMPLIFIERS

(71) Applicant: XILINX, INC., San Jose, CA (US)

(72) Inventors: Vipul Bajaj, Dublin (IE); Bruno Miguel Vaz, Sao Domingos de Rana (PT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/064,595

(22) Filed: Oct. 6, 2020

(51) Int. Cl.
*H03F 3/45* (2006.01)
(52) U.S. Cl.
CPC ... *H03F 3/45192* (2013.01); *H03F 2200/144* (2013.01); *H03F 2200/84* (2013.01)
(58) Field of Classification Search
CPC .......... H03F 3/45192; H03F 2200/144; H03F 2200/84
USPC ................................. 330/252–261
See application file for complete search history.

(56) References Cited

U.S. PATENT DOCUMENTS

| | | | | |
|---|---|---|---|---|
| 7,656,139 B2* | 2/2010 | van Ettinger | ........... | G05F 1/575 323/280 |
| 8,279,003 B2* | 10/2012 | Touzard | .................... | H03F 1/26 330/252 |
| 2006/0232337 A1* | 10/2006 | Caminada | ........... | H03F 3/45659 330/260 |
| 2009/0108943 A1* | 4/2009 | Kuo | ......................... | H03F 3/19 330/301 |

* cited by examiner

*Primary Examiner* — Samuel S Outten
*Assistant Examiner* — Khiem D Nguyen
(74) *Attorney, Agent, or Firm* — Patterson + Sheridan, LLP (57) ABSTRACT

Cross-coupling of switched-capacitor output common-mode feedback capacitors in dynamic residue amplifiers is provided via a cross-coupled amplifier, comprising: a current source connected to a first node; a feedback capacitor connected to the first node and a second node; a feedback resistor connected between the second node and ground; an amplifier having an input connected to the second node; a gain transistor having: a drain connected to the first node; a source connected to ground; and a gate connected to an output of the amplifier; and a load capacitor connected to the first node and ground.

19 Claims, 6 Drawing Sheets

CROSS-COUPLING OF SWITCHED-CAPACITOR OUTPUT COMMON-MODE FEEDBACK CAPACITORS IN DYNAMIC RESIDUE AMPLIFIERS

TECHNICAL FIELD

Examples of the present disclosure generally relate to managing speed and power efficiency in electronic circuits.

BACKGROUND

Switched capacitor common-mode feedback is often used to control the output common-mode in dynamic (also referred to as switched) residue amplifiers.

Output Common-Mode Feedback (OCMFB) beneficially provides linear performance without parasitic poles in the common-mode feedback loop, but presents the amplifier with a large and differential load, which reduces the efficiency of the amplifier and may require a designer to use higher power of longer amplification time to overcome this additional load.

SUMMARY

One embodiment described herein is a cross-coupled amplifier, comprising: a current source connected to a first node; a feedback capacitor connected to the first node and a second node; a feedback resistor connected between the second node and ground; an amplifier having an input connected to the second node; a gain transistor having: a drain connected to the first node; a source connected to ground; and a gate connected to an output of the amplifier; and a load capacitor connected to the first node and ground.

One embodiment described herein is a mirror amplifier output branch, comprising: a first transistor having: a first source connected to a positive rail; and a first drain connected to a first node; a second transistor having: a second source connected to the positive rail; and a second drain connected to a second node; a third transistor having: a third source connected to a ground rail; a third drain connected to the first node; and a third gate connected to a third node; a fourth transistor having: a fourth source connected to the ground rail; a fourth drain connected to the first node; and a fourth gate connected to a fourth node; load resistances separating the first node from the second node; feedback resistive elements separating the third node from the fourth node; a first capacitor connected to the first node and the fourth node; and a second capacitor connect to the second node and the third node.

One embodiment described herein is a mirror amplifier, comprising: a mirror amplifier input branch including a positive rail, a ground rail, and a network of switched capacitors; and a mirror amplifier output branch connected to the positive rail and the ground rail including cross-coupled capacitors.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe techniques to apply cross-coupling of switched output common-mode feedback capacitors in dynamic residue amplifiers to advantageously reduce area, reduce power consumption, reduce parasitic losses, improve speed, and combinations thereof. By cross-coupling the OCMFB structure in an amplifier, the amplifier can reuse the current from the feedback path to boost the differential gain ($G_m$).

Figure 1A:
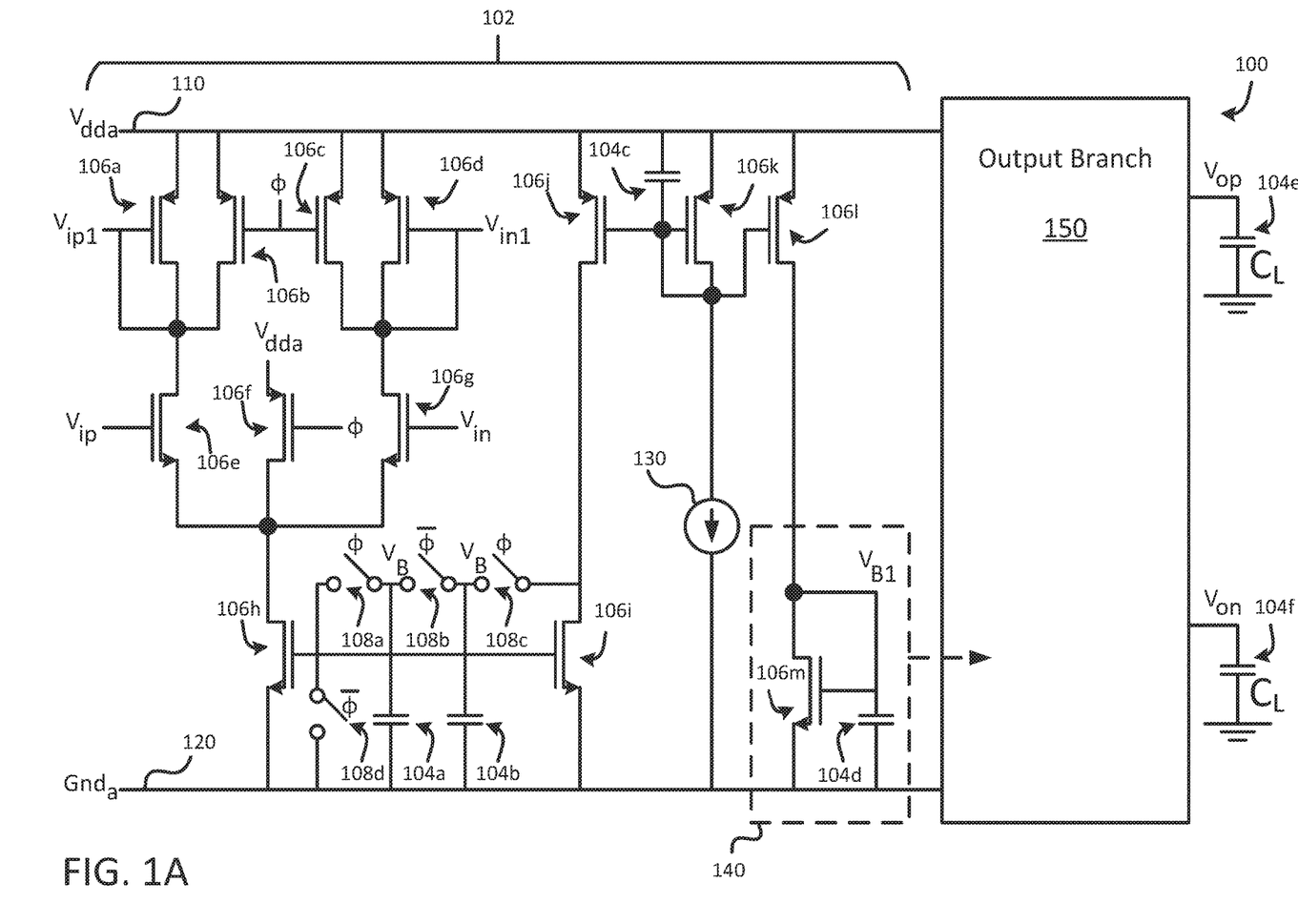
FIG. 1A and FIG. 1B illustrate example circuits, according to embodiments of the present disclosure.
Figure 1B:
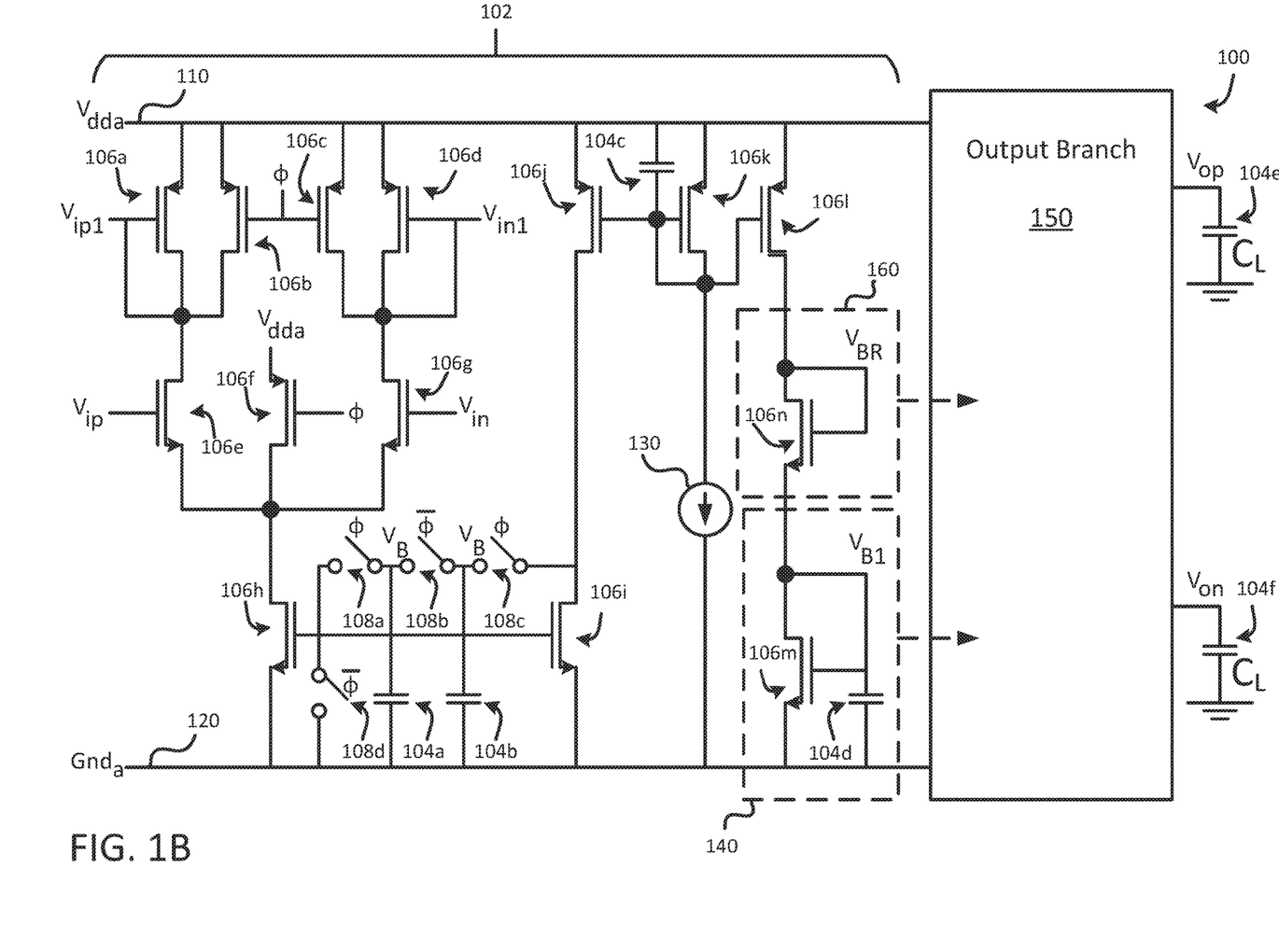

FIG. 1A and FIG. 1B illustrate example mirror amplifier circuits 100, according to embodiments of the present disclosure. The mirror amplifier circuits 100 includes a positive rail 110, carrying a positive supply voltage ($V_{dda}$), and a ground rail 120, carrying a ground state ($Gnd_a$ or other reference voltage), between which various circuit elements are disposed, including a mirror amplifier output branch 150.

Figure 2A:
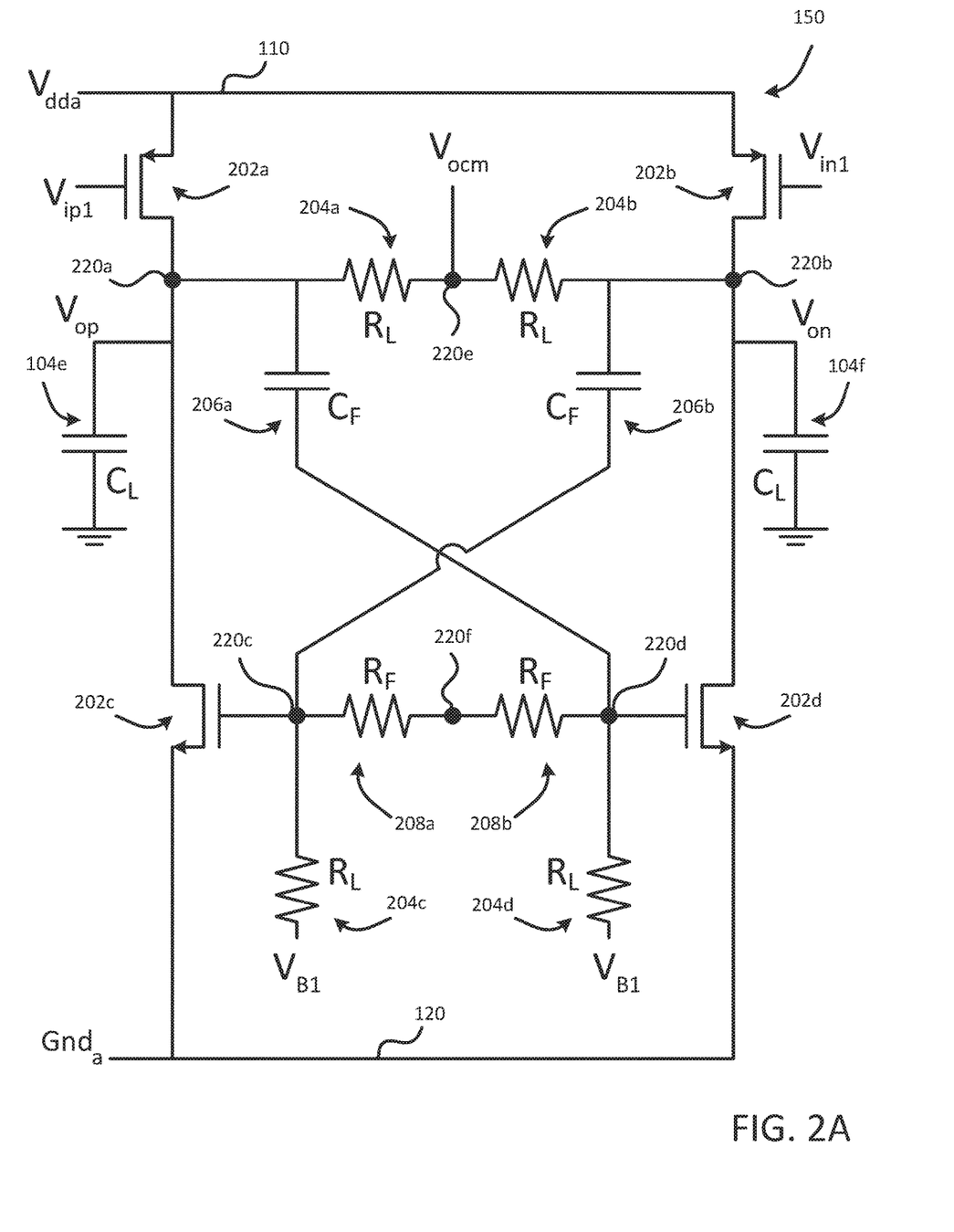
FIG. 2A illustrates a first circuit arrangement for a mirror amplifier, according to embodiments of the present disclosure.
Figure 2B:
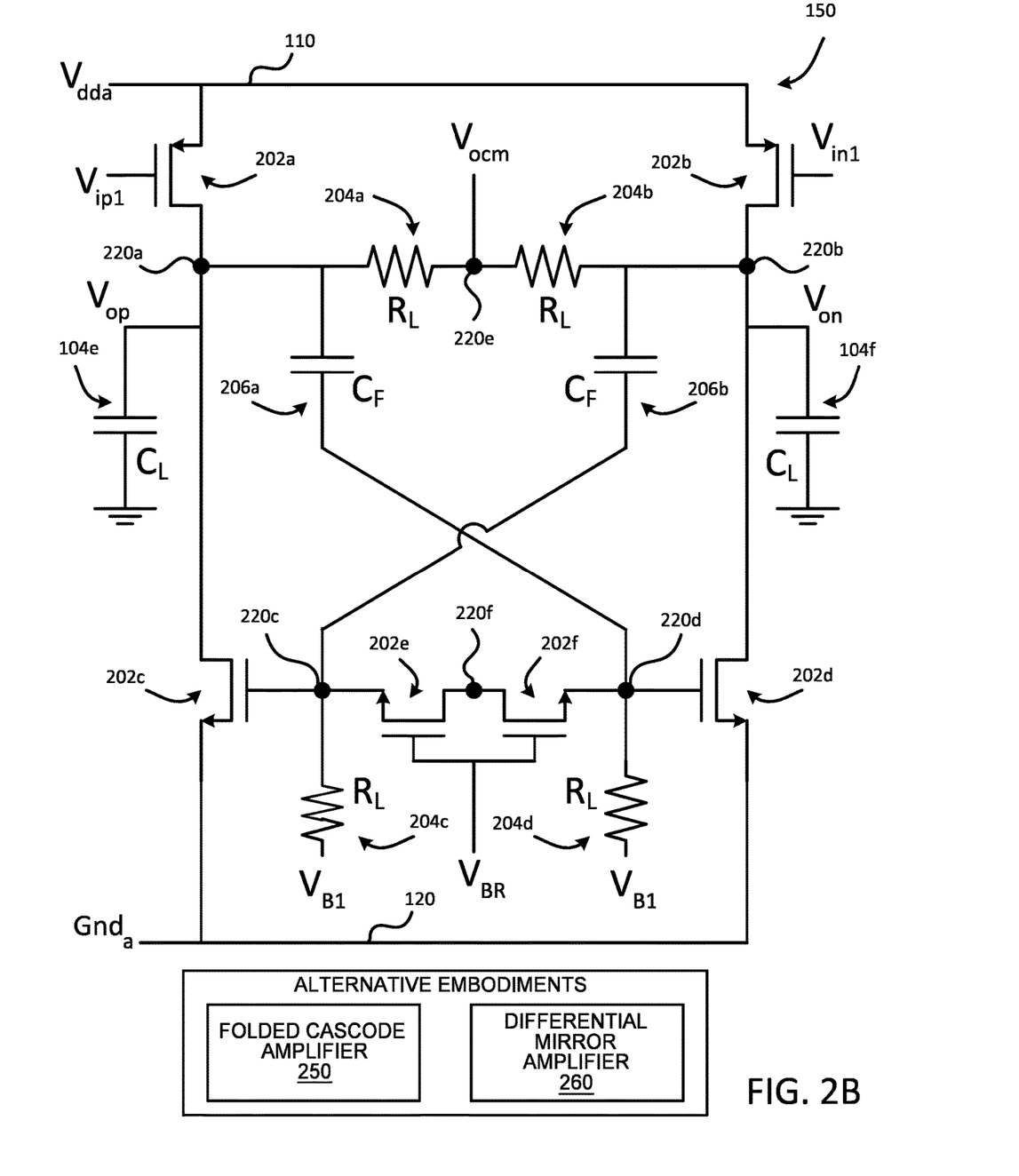
FIG. 2B illustrates a second circuit arrangement for a mirror amplifier, according to embodiments of the present disclosure.
Figure 3:
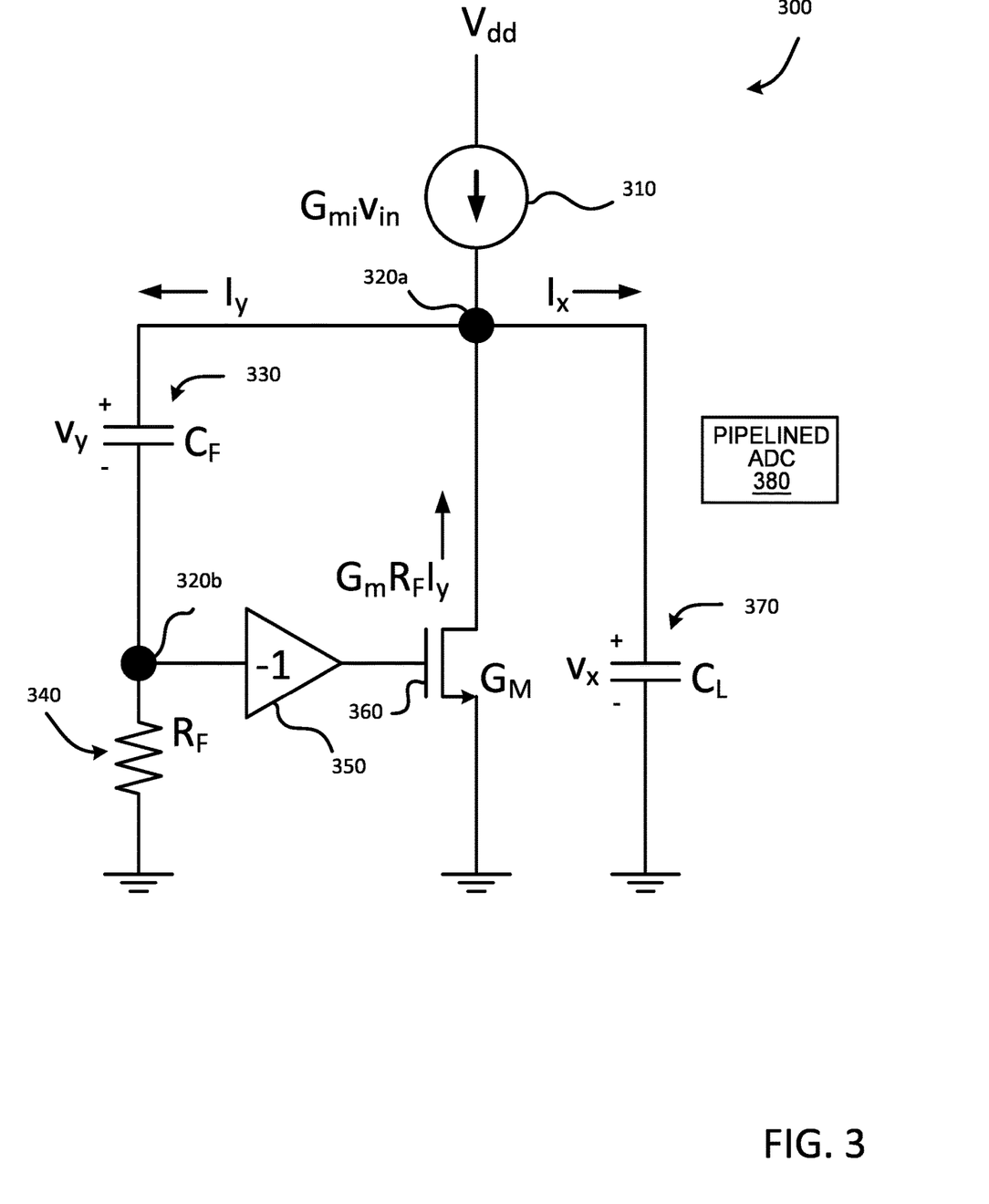
FIG. 3 illustrates a single-ended model for OCMFB, according to embodiments of the present disclosure.

The illustrated examples show the input branch 102 of a mirror amplifier circuit 100 made of a plurality of capacitors 104a-f, a plurality of transistors 106a-m (in FIG. 1A) or 106a-n (in FIG. 1B), and a plurality of switches 108a-d. The mirror amplifier output branch 150, as will be described in greater detail in regard to FIG. 2A, FIG. 2B, and FIG. 3 is also included between the positive rail 110 and the ground rail 120 to provide increased output dynamic range and output common mode voltage feedback for the mirror amplifier circuit 100. The outputs for the mirror amplifier circuits 100 are provided as a positive output voltage ($V_{op}$) and a negative output voltage ($V_{on}$) measured over a load capacitance ($C_L$) emulated by a fifth capacitor 104e and a sixth capacitor 104f, respectively.

The input branch 102 of the mirror amplifier circuit 100, or other circuits included between the positive rail 110 and the ground rail 120 can share several inputs with components included in the mirror amplifier output branch 150 (e.g., positive input voltage $V_{ip1}$ and negative input voltage $V_{in1}$) or provide one or more reference voltages or currents to the mirror amplifier output branch 150. For example, in FIG. 1A and FIG. 1B, a bias voltage supply 140 provides a reference for a bias voltage ($V_{B1}$) in the mirror amplifier 150. In another example, in FIG. 1B, a resistive bias voltage supply 160 provides a reference for a resistive bias voltage ($V_{BR}$) in the mirror amplifier output branch 150 for use in controlling a feedback resistance ($R_F$) provided via transistors.

Although FIG. 1A and FIG. 1B illustrate mirror amplifier circuits 100, in various embodiments different amplifier circuitry can be provided in diverse arrangements between a positive rail 110 and a ground rail 120 (or a negative rail) as telescopic amplifiers, folded-cascode amplifiers, mirror amplifiers, etc. Accordingly, different circuit elements in different arrangement than as shown in FIG. 1A or FIG. 1B can be used in conjunction with the OCMFB techniques described in the mirror amplifier output branch 150 described herein.

The mirror amplifier circuit 100 provides a positive output ($V_{op}$) and a negative output ($V_{on}$) as measured over a load capacitance ($C_L$) indicated in FIG. 1A and FIG. 1B as the fifth capacitor 104e and the sixth capacitor 104f, respectively.

FIG. 2A illustrates a first circuit arrangement for a mirror amplifier output branch 150, according to embodiments of the present disclosure. FIG. 2B illustrates a second circuit arrangement for a mirror amplifier output branch 150, according to embodiments of the present disclosure.

In each of FIGS. 2A and 2B, the mirror amplifier output branch 150 is connected between the positive rail 110 and the ground rail 120 shared with the remainder of the mirror amplifier circuit 100 (of FIG. 1A and FIG. 1B). As illustrated, the mirror amplifier output branch 150 includes several metal oxide semiconductor field effect transistors (MOSFETs) arranged between the positive rail 110 and the ground rail 120, but in other embodiments, different types of transistors can be used in corresponding arrangements.

A first transistor 202a and a second transistor 202b are illustrated as p-channel transistors (e.g., PMOS) with a respective first source and second source connected to the positive rail 110. The first drain of the first transistor 202a is connected to a first node 220a in the mirror amplifier output branch 150, and the second drain of the second transistor 202b is connected to a second node 220b in the mirror amplifier output branch 150. The first gate of the first transistor 202a is connected to a positive input voltage (Vip1) and the second gate of the second transistor 202b is connected to a negative input voltage (Vin1). In various embodiments, the positive and negative input voltages supplied to the gates of the first transistor 202a and the second transistor 202b are shared with other elements in the mirror amplifier circuit 100 (e.g., the first transistor 106a and the fourth transistor 106d of FIG. 1A or FIG. 1B).

The first node 220a and the second node 220b are the outputs of the mirror amplifier 100, which in common-mode have to be adjusted by the new OCMFB circuitry. As shown in FIG. 2A and FIG. 2B, the fifth capacitor 104e over which the positive voltage output ($V_{op}$) is measured is connected between the first node 220a and ground. Similarly, the sixth capacitor 104f over which the negative voltage output ($V_{on}$) is measured is shown in FIG. 2A and FIG. 2B connected between the second node 220b and ground.

A third transistor 202c and a fourth transistor 202d are illustrated a n-channel transistors (e.g., NMOS) with a respective third source and fourth source connected to the ground rail 120. The third drain of the third transistor 202c is connected to a first node 220a in the mirror amplifier 100, and the fourth drain of the fourth transistor 202d is connected to a second node 220b in the mirror amplifier output branch 150. The third gate of the third transistor 202c is connected to a third node 220c in the mirror amplifier output branch 150, and the fourth gate of the fourth transistor 202d is connected to a fourth node 220d in the mirror amplifier output branch 150.

The mirror amplifier output branch 150 includes a first load resistor 204a, having a load resistance ($R_L$). In various embodiments, the load resistance ($R_L$) is emulated by means of equivalent capacitance circuits. The first load resistor 204a is connected between the first node 220a and a fifth node 220e. The fifth node 220e is associated with an output common mode voltage ($V_{ocm}$) from the mirror amplifier output branch 150. Similarly, a second load resistor 204b, also having a load resistance ($R_L$), is connected between the second node 220b and the fifth node 220e. A third load resistor 204c, having a load resistance ($R_L$), is connected between the third node 220c and a voltage source (e.g., the bias voltage supply 140 of FIG. 1A or FIG. 1B) supplying a bias voltage ($V_{B1}$). Similarly, a fourth load resistor 204d, having a load resistance ($R_L$), is connected between the fourth node 220d and the voltage source supplying a bias voltage ($V_{B1}$).

A first and a second resistive element separate the third node 220c from the fourth node 220d, and define a sixth node 220f therebetween. In FIG. 2A, the resistive elements are a first feedback resistor 208a and a second feedback resistor 208b, each having a feedback resistance ($R_F$). In FIG. 2B, the resistive elements are a fifth transistor 202e and a sixth transistor 202f that are controlled to exhibit a feedback resistance ($R_F$). In FIG. 2B, the fifth transistor 202e is illustrated as a n-channel transistor having a source connected to the third node 220c, a drain connected to the sixth node 220f, and a gate connected to a voltage source (e.g., the a resistive bias voltage supply 160 of FIG. 1B) supplying a resistive bias voltage ($V_{BR}$). Similarly, the sixth transistor 202f is illustrated as a n-channel transistor having a source connected to the fourth node 220d, a drain connected to the sixth node 220f, and a gate connected to the voltage source supplying the resistive bias voltage ($V_{BR}$). The resistive bias voltage ($V_{BR}$) controls the impedance the fifth transistor 202e and the sixth transistor 202f switch and affect the apparent resistance between the third node 220c and the sixth node 220f and between the fourth node 220d and the sixth node 220f to effectively providing a process/voltage/temperature (PVT) controlled feedback resistance ($R_F$).

In various embodiments, when using transistors for the resistive elements as in FIG. 2B, each of the transistors 202a-f included in the mirror amplifier output branch 150 are produced via a shared die, so that each of the transistors 202a-f are produced in a shared process corner. Accordingly, by using transistors manufactured in a shared process corner, those transistors exhibit similar electrical properties due to variances associated with the particular process corner (including slew rate and duty cycles) allowing for finer variation of the feedback resistance ($R_F$) and providing best control of the common mode feedback voltage ($V_{ocm}$).

The mirror amplifiers output branch 150 in each of FIG. 2A and FIG. 2B include a set of cross-coupled capacitors 206a-b. The first capacitor 206a is coupled to the first node 220a and the fourth node 220d, whereas the second capacitor 206b is coupled to the second node 220b and the third node 220c; defining a cross-coupled arrangements of the feedback capacitors 206a-b that allows for current to be reused to improve the power efficiency in the mirror amplifier for a given area or size of deployment.

When using a differential telescopic amplifier, the cross-coupled capacitors 206a-b are arranged such that the first capacitor 206a is connected to the first node 220a and to the gate of the second transistor 202b, and the second capacitor 206b is connected to the second node 220b and to the gate of the first transistor 202a with the first resistor 204a and the second resistor 204b having load resistances ($R_L$) connected between the gates of the first transistor 202a and the second transistor 202b.

When using a differential folded-cascode amplifier 250 or a differential mirror amplifier 260, the cross-coupled capacitors 206a-b are arranged such that the first capacitor 206a is connected to the first node 220a and to the gate of the fourth transistor 202d, and the second capacitor 206b is connected to the second node 220b and to the gate of the third transistor 202c with the first resistor 204a and the second resistor 204b having load resistances ($R_L$) connected between the gates of the third transistor 202c and the fourth transistor 202d.

FIG. 3 illustrates a single-ended model 300 for OCMFB, according to embodiments of the present disclosure. FIG. 3 illustrates operation of an active half of a current mirror (e.g., the mirror amplifier output branch 150 of FIG. 2A or FIG. 2B).

In the model 300, a current source 310 directs a current of ($G_{mi}V_{in}$) to a first node 320a, which includes a first current component $I_x$ and a second current component $I_y$ on opposing paths from the first node 320a. A first path, on which the first current $I_x$ flows, includes a load capacitor 370 (e.g., one of capacitor 104e or 104f from FIG. 1A or 1B) between the first node 320a and ground. A second path, on which the second current $I_y$ flows, includes a feedback capacitor 330 with a feedback capacitance ($C_F$) between the first node 320a and a second node 320b. A feedback resistor 340 with a feedback resistance ($R_F$) is disposed on the first path between the second node 320b and ground.

The first current $I_x$ and the second current $I_y$ are related to one another according to Formula 1.

$$\frac{I_y}{C_F} = \frac{I_x}{C_L} \quad \text{[Formula 1]}$$

Additionally or alternatively, the first current $I_x$ can be expressed according to Formula 2 or Formula 3, and the second current $I_y$ can be expressed according to Formula 4 or Formula 5, where k is any positive integer selected to control the operating mode of the mirror amplifier according to Formula 6 and the ranges identified in Formula 7.

$$I_x = \frac{C_L G_{mi} V_{in}}{C_L + C_F} \quad \text{[Formula 2]}$$

$$I_x = G_{mi} V_{in} + (k-1) I_y \quad \text{[Formula 3]}$$

$$I_y = \frac{C_F G_{mi} V_{in}}{C_L + C_F} \quad \text{[Formula 4]}$$

$$I_y = \frac{G_{mi} V_{in}}{\frac{C_L}{C_F} - k + 1} \quad \text{[Formula 5]}$$

$$k = \frac{G_m R_F - 1}{C_L / C_F} \quad \text{[Formula 6]}$$

$$k \begin{cases} < 1 & \text{Amplifier} \\ = 1 & \text{Integrator} \\ > 1 & \text{Latch Amplifier} \end{cases} \quad \text{[Formula 7]}$$

A third path compensates for the second current $I_y$, with a current controlled current source (CCCS), which represents the cross-coupling effect of capacitors 206a-b in FIG. 2A-28, with an input connected to the second node 320b and an output coupled to a gate of gain transistor 360. In FIG. 3, the gain transistor 360 is illustrated as a n-channel MOSFET with a drain connected to the first node 320a and a source connected to ground.

The ratio of $C_L$ to $C_F$, along with the value set for GmRF, determines the amount of boosted gain ($G_m$) that is obtained from the cross-coupled structure. As the ratio of $C_L$ to $C_F$ is based on circuit geometry, the value thereof can be precisely controlled to yield a desired value with a high degree of accuracy. The value of $G_m$ is based on the transconducance of a MOS device (e.g., the transconductance of the gain transistor 360) and $R_F$ is the resistance of the feedback resistor 340, which can vary drastically in different process corners for the production of the transistors used in the cross-coupled structure when using a transistor as a resistive element. Accordingly, to precisely control the value of $G_m R_F$, $R_F$ can be provided by a MOS device (e.g., the fifth and sixth transistors 202e-f per FIG. 2B) in a shared process corner with the other transistors, and is determined according to Formula 8, where k is any positive real number based on the amount of $G_m$-boost desired from the cross-coupling arrangement.

$$R_F = k/G_m \quad \text{[Formula 8]}$$

In various embodiments, an additional NMOS diode in a bias arm of the biasing circuit (e.g., the fourteenth transistor 106n in the bias voltage supply 160 of FIG. 1B) that the mirror amplifier output branch 150 is connected to. Based on the size of the additional NMOS, the value for k can be accurately controlled across process corners, thus accounting for variations in manufacturing the various MOS devices. As will be appreciated, in FINFET (Fin Field Effect Transistor) technologies the modulation of a threshold voltage ($V_{th}$) is negligible with respect to Vestigial Sideband (VSB) modulation, and therefore has negligible impact on the feedback resistance $R_F$ in a MOS device.

The input referred noise power ($P_N$) of an integrator for a given gain (A) is given in Formula 9, where γ is an excess noise factor and T is the temperature of the gain transistor 360.

$$P_N = \frac{kT\gamma}{A * C_L} \quad \text{[Formula 9]}$$

In the present disclosure, the $G_m$-boost is obtained by acting on the signal and noise sampled at the output of the amplifier, so that both increase in gain via the cross-coupling arrangement. Stated differently, the cross-coupling emulates a negative capacitance (e.g., $C_N$) so that the original signal current ($G_{mi}V_{in}$) from the first current source 310 flows through a smaller capacitance ($C_L-C_N$) for the desired gain (A), whereas the boosted signal current $(G_m R_F-1)I_y$ flows through the emulated negative capacitance $(C_N)$ to obtain the desired gain (A).

The boosted signal current does not participate in noise averaging with time, thereby the input referred noise power of the amplifier increases with the increase in the differential $G_m$-boost of the amplifier according to Formula 10.

$$v_n = \frac{kT\gamma}{A(C_L - C_N)} \quad \text{[Formula 10]}$$

In principle, this increased noise is corresponding increases in speed such that the noise floor remains the same. In the context of a pipelined ADC circuit 380 or other converters, the speed of the amplifier is one of several elements that affect the noise floor, therefore various embodiments set the value for $G_m R_F$ according to Formula 11 to limit for the impact on the noise floor of the converter and the thermal noise of $R_F$.

$$1 <= G_m R_F <= 2 \quad \text{[Formula 11]}$$

Figure 4:
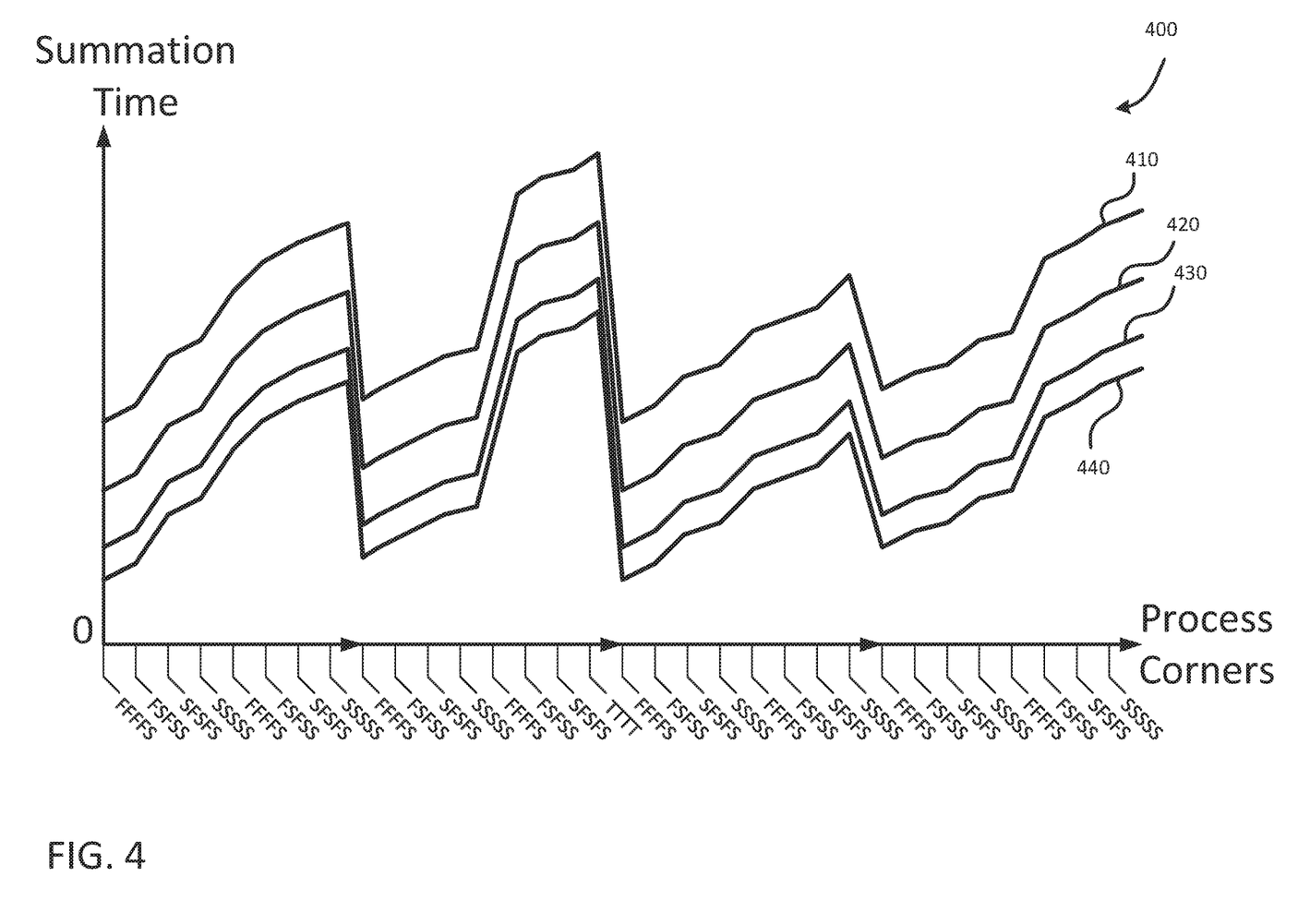
FIG. 4 is a timing chart for reaching a target gain in a mirror amplifier, according to embodiments of the present disclosure.

FIG. 4 is a timing chart 400 for reaching a target gain in an integrating mirror amplifier, according to embodiments of the present disclosure. The timing chart 400 shows time on the Y axis and various process corners on the X axis. When the capacitors are cross-coupled as described in the present disclosure, the integration time of the resultant mirror amplifier is improved across all process corners, as is shown in FIG. 4, where the impact of $G_m R_F$ of the integration time in reaching a gain of four is shown for a first $G_m R_F$ value 410 of zero, a second $G_m R_F$ value 420 of one, a third $G_m R_F$ value 430 of two, and a fourth $G_m R_F$ value 440 of four. As will be appreciated, $G_m R_F$ may be set to other values than those shown in FIG. 4 according to the design needs of the mirror amplifier and the circuit in which the mirror amplifier is included. Additionally, or alternatively, a designer can deploy the present described OCMFB to provide the same speed, but with less power than earlier mirror amplifiers.

While the foregoing is directed to specific examples, other and further examples may be devised without departing from the basic scope thereof, and the scope thereof is determined by the claims that follow.

What is claimed is:

1. A circuit, comprising:
   a current source directly connected to a first node;
   a feedback capacitor connected to the first node and a second node;
   a feedback resistor connected between the second node and ground;
   an amplifier having an input connected to the second node;
   a gain transistor having:
      a drain connected to the first node;
      a source directly connected to ground; and
      a gate connected to an output of the amplifier; and
   a load capacitor directly connected to the first node and ground.

2. The circuit of claim 1, wherein a capacitance ratio of the load capacitor to the feedback capacitor is tuned relative to a current produced by the gain transistor to set the amplifier to one of an amplifier mode, a latch amplifier mode, or an integrator mode.

3. The circuit of claim 1, wherein the feedback resistor is produced in a shared process corner with the gain transistor.

4. The circuit of claim 3, wherein the gain transistor is controlled via a resistive bias voltage set by an NMOS diode produced in the shared process corner.

5. A mirror amplifier output branch, comprising:
   a first transistor having:
      a first source connected to a positive rail; and
      a first drain connected to a first node;
   a second transistor having:
      a second source connected to the positive rail; and
      a second drain connected to a second node;
   a third transistor having:
      a third source connected to a ground rail;
      a third drain connected to the first node; and
      a third gate connected to a third node;
   a fourth transistor having:
      a fourth source connected to the ground rail;
      a fourth drain connected to the second node; and
      a fourth gate connected to a fourth node;
   load resistances separating the first node from the second node;
   feedback resistive elements separating the third node from the fourth node;
   a first capacitor connected to the first node and the fourth node; and
   a second capacitor connect to the second node and the third node.

6. The mirror amplifier output branch of claim 5, further comprising:
   a first load resistor of the load resistances connected to the first node and a fifth node, wherein the fifth node is associated with an output common mode voltage;
   a second load resistor of the load resistances connected to the second node and the fifth node;
   a third load resistor of the load resistances connected to the third node and a bias voltage; and
   a fourth load resistor of the load resistances connected to the fourth node and the bias voltage.

7. The mirror amplifier output branch of claim 6, wherein the feedback resistive elements include:
   a fifth transistor having:
      a fifth source connected to the third node;
      a fifth drain connected to a sixth node; and
      a fifth gate connected to a resistive bias voltage; and
   a sixth transistor having:
      a sixth source connected to the fourth node;
      a sixth drain connected to the sixth node; and
      a sixth gate connected to the resistive bias voltage.

8. The mirror amplifier output branch of claim 7, wherein the first, second, third, fourth, fifth, and sixth transistors are produced in a shared process corner.

9. The mirror amplifier output branch of claim 7, wherein the resistive bias voltage is determined via a control node of a controller transistor.

10. The mirror amplifier output branch of claim 5, wherein a capacitance for the first capacitor and the second capacitor is tuned based on a load capacitance to set an operating mode of a mirror amplifier.

11. The mirror amplifier output branch of claim 5, wherein the positive rail and the ground rail are connected to a pipelined analog to digital converter circuit.

12. A mirror amplifier, comprising:
    a mirror amplifier input branch including a positive rail, a ground rail, and a network of switched capacitors that are connected and disconnected using a plurality of switches; and a mirror amplifier output branch connected to the positive rail and the ground rail, the mirror amplifier output branch comprising:
cross-coupled capacitors; and
resistive elements coupled between the cross-coupled capacitors, where the resistive elements are configured to control feedback in the mirror amplifier output branch, wherein the resistive elements include a first transistor and a second transistor, wherein a first source of the first transistor is connected to a second capacitor of the cross-coupled capacitors and a second source of the second transistor is connected to a first capacitor of the cross-coupled capacitors, wherein a first drain of the first transistor is connected to a second drain of the second transistor, and wherein a first gate of the first transistor and a second gate of the second transistor are connected to a voltage source providing a resistive bias voltage.

13. The mirror amplifier of claim 12, wherein the mirror amplifier output branch comprises an Output Common-Mode Feedback circuit.

14. The mirror amplifier of claim 13, wherein the Output Common-Mode Feedback circuit is used in conjunction with a differential mirror amplifier.

15. The mirror amplifier of claim 13, wherein the Output Common-Mode Feedback circuit is used in conjunction with a folded cascode amplifier.

16. The mirror amplifier of claim 12, wherein the cross-coupled capacitors increase differential gain of the mirror amplifier.

17. The mirror amplifier of claim 12, wherein the cross-coupled capacitors increase operational speed of the mirror amplifier.

18. The mirror amplifier of claim 12, wherein the resistive elements are metal oxide semiconductor devices constructed in a shared process corner with a plurality of transistors included in the mirror amplifier output branch.

19. The mirror amplifier of claim 18, wherein a first load resistance is connected to the first capacitor and an output node associated with an output common mode voltage, wherein a second load resistor is connected to the output node and the second capacitor, wherein a second voltage source providing a bias voltage is connected to the second capacitor and the first source via a third load resistance, and wherein the second voltage source is connected to the first capacitor and the second source via a fourth load resistance, wherein a capacitance ratio of a load capacitance to an internal feedback capacitance is tuned relative to a current produced by a gain transistor to set a behavior of the mirror amplifier to one of an amplifier mode, a latch amplifier mode, or an integrator mode.

* * * * *